(12) United States Patent
Matsuo et al.

(10) Patent No.: US 7,537,882 B2
(45) Date of Patent: May 26, 2009

(54) ANTI-REFLECTIVE COATING COMPOSITION AND PRODUCTION METHOD FOR PATTERN USING THE SAME

(75) Inventors: Jirou Matsuo, Chiba (JP); Kiyofumi Takano, Chiba (JP); Yusuke Takano, Kakegawa (JP); Yasushi Akiyama, Kakegawa (JP)

(73) Assignees: Dainippon Ink and Chemicals, Inc., Tokyo (JP); AZ Electronic Materials (Japan) K.K., Tokyo (JP)

( * ) Notice: Subject to any disclaimer, the term of this patent is extended or adjusted under 35 U.S.C. 154(b) by 195 days.

(21) Appl. No.: 11/630,411

(22) PCT Filed: Jun. 29, 2005

(86) PCT No.: PCT/JP2005/012001

§ 371 (c)(1),
(2), (4) Date: Dec. 21, 2006

(87) PCT Pub. No.: WO2006/003958

PCT Pub. Date: Jan. 12, 2006

(65) Prior Publication Data

US 2007/0238048 A1    Oct. 11, 2007

(30) Foreign Application Priority Data

Jun. 30, 2004    (JP) ............................. 2004-194423

(51) Int. Cl.
*G03F 7/11* (2006.01)
*H01L 21/027* (2006.01)

(52) U.S. Cl. .............. 430/273.1; 523/300; 524/131; 524/144; 438/952

(58) Field of Classification Search .......... 438/952; 430/273.1; 524/144
See application file for complete search history.

(56) References Cited

U.S. PATENT DOCUMENTS

| | | | | |
|---|---|---|---|---|
| 5,330,883 A | * | 7/1994 | Garza | .......................... 430/513 |
| 5,541,037 A | * | 7/1996 | Hatakeyama et al. | .... 430/273.1 |
| 5,611,850 A | | 3/1997 | Nishi et al. | |
| 5,783,362 A | * | 7/1998 | Wakiya et al. | ........... 430/273.1 |
| 5,853,471 A | | 12/1998 | Yoshida et al. | |
| 6,309,789 B1 | | 10/2001 | Takano et al. | |
| 2002/0187425 A1 | * | 12/2002 | Savariar-Hauck et al. | 430/272.1 |

FOREIGN PATENT DOCUMENTS

| | | |
|---|---|---|
| JP | 8-292562 A | 11/1996 |
| JP | 8-305024 A | 11/1996 |
| JP | 8-305032 A | 11/1996 |
| JP | 8-320569 A | 12/1996 |
| JP | 9-291228 A | 11/1997 |
| JP | 10-3001 A | 1/1998 |
| JP | 11-349857 A | 12/1999 |
| JP | 2004-83412 A | 3/2004 |
| WO | WO 99/63010 A1 | 12/1999 |

OTHER PUBLICATIONS

English translation of JP, 2004-083412, A (2004) from machine translation from AIPN Japan Patent Office Natinal center for Industrial Property Information and Training, generated Sep. 1, 2008, 20 pages.*
Derwent-Acc-No. 2004-321010, English abstract of JP 2004-083412 A published Mar. 18, 2004, 5 pages, From Derwent Information Ltd, Derwent -Week: 20430.*

* cited by examiner

*Primary Examiner*—Cynthia Hamilton
(74) *Attorney, Agent, or Firm*—Edwards Angell Palmer & Dodge LLP

(57) ABSTRACT

The object of the present invention is to provide an anti-reflective coating composition having excellent coating properties while maintaining performance as an anti-reflective film. An anti-reflective coating composition comprising at least the following components (A), (B), (C), (D), and (E) and a production method for a pattern using the anti-reflective coating composition, (A) perfluoroalkyl•alkylenesulfonic acid represented by the following formula (1): $C_nF_{2n+1}(CH_2CH_2)_mSO_3H$ (1) (wherein, n represents an integer from 1 to 20, and m represents an integer from 0 to 20); (B) organic amine; (C) water-soluble polymer; (D) perfluoroalkylethyl group containing compound represented by the following formula (2): $C_kF_{2k+1}CH_2CH_2$—X—Y (2) (wherein, k represents an integer from 1 to 20, x represents a single bond or a divalent linking group, y represents an anionic group or a nonionic group, and this compound has a structure different from that of the component (A)); and (E) water.

7 Claims, No Drawings

ANTI-REFLECTIVE COATING COMPOSITION AND PRODUCTION METHOD FOR PATTERN USING THE SAME

TECHNICAL FIELD

The present invention relates to an anti-reflective coating composition having excellent coating properties and a production method for a pattern using the same.

BACKGROUND ART

In the production of semiconductor elements, lithographic technology is applied in which a photoresist film is formed on a substrate such as a silicone wafer, and actinic radiation is irradiated selectively to the photoresist film, and this is developed to produce a resist pattern on the substrate.

Recently, pattern technology to form finer patterns by lithographic processes has made a rapid progress in order to attain a higher degree of integration in LSI. In forming finer patterns, various proposals have been suggested for any and all of every process in lithography and material used such as photoresists, anti-reflective coatings, exposure processes, exposure apparatuses, developers, developing processes, developing apparatuses etc.

For example, Patent Document 1 discloses that an anti-reflective film containing a fluorine based surfactant having a low refractive index is formed on a resist layer to prevent adverse effects on production of resist patterns due to reflective light from the surface of the resist layer. This has effects that when an anti-reflective film is formed on a resist layer, amplitude of a curve showing the relationship between the thickness of the resist film and sensitivity decrease, and even if the thickness of the resist layer varies, sensitivity variation is small and consequently dimensional variation is also small. In addition, this also has effects that standing waves which are caused by the interference between incident radiation and reflective radiation or reflective radiation by using anti-reflective film. However, coating properties to the surface of the resist are not necessarily sufficient. In addition, the substrate is desired to be larger and larger in recent years. Therefore, an anti-reflective coating composition having excellent coating properties is desired.

Patent Document 1: Japanese Unexamined Patent Application, First Publication No. 2004-349857 (pages 4 to 5)

DISCLOSURE OF THE INVENTION

Problems to be Solved

In consideration of the above-described problems, it is an object of the present invention to provide an anti-reflective coating composition which can provide an anti-reflective film having excellent anti-reflective properties, and, in particular, which has excellent coating properties, and a production method for a pattern using the anti-reflective coating composition.

Means for Solving the Problem

As a result of conducting diligent research that focused on solving the problems, the inventors found that these problems can be solved by using a composition comprising at least the following components (A) to (E) and they thereby achieved to the present invention.

That is, the present invention provides an anti-reflective coating composition comprising at least the following components (A), (B), (C), (D), and (E) and a production method for a pattern using the anti-reflective coating composition.

(A) perfluoroalkyl•alkylenesulfonic acid represented by the following formula (1):

$$C_nF_{2n+1}(CH_2CH_2)_mSO_3H \quad (1)$$

(wherein, n represents an integer from 1 to 20, and m represents an integer from 0 to 20)

(B) organic amine (C) water-soluble polymer (D) perfluoroalkylethyl group containing compound represented by the following formula (2):

$$C_kF_{2k+1}CH_2CH_2-X-Y \quad (2)$$

(wherein, k represents an integer from 1 to 20, x represents a single bond or a divalent linking group, y represents an anionic group or a nonionic group, and this compound has a structure different from that of the component (A))

(E) water

When the anti-reflective coating composition does not contain any one of the components among the components (A) to (E), the object is not achieved. In addition, the object is achieved through not only the main functions of the essential components which are explained below but also magnifies the effects of these components.

Effects of the Present Invention

According to the present invention, it is possible to provide an anti-interferential film having excellent coating properties, that is, an anti-interferential film having a small minimum drop amount which is sufficient to prevent from decreasing the pattern size accuracy (variation of pattern width) generated in a photoresist film by interference with reflective light from a substrate; a production method for a resist pattern which does not cause a degradation of a pattern shape such as a T-top and a rounded top which is caused by an intermix of a chemical amplification resist and an anti-reflective film; and an anti-reflective coating composition which is used in the production method for a resist pattern.

BEST MODE FOR CARRYING OUT THE INVENTION

The component (A) used in the present invention is perfluoroalkyl•alkylenesulfonic acid (abbreviated by "component (A)" below) represented by the following formula (1):

$$C_nF_{2n+1}(CH_2CH_2)_mSO_3H \quad (1)$$

(wherein n represents an integer from 1 to 20, and m represents an integer from 0 to 20).

The component (A) is a main solid component in the composition of the present invention, and an essential component to have a low refractive index (generally, larger the content of fluorine is, larger the refractive index is) and consequently to exert anti-reflective effects.

The component (A) changes water solubility thereof, and stability over time and refractive index of a resulting film depending on the integer of m and n. Therefore, it is important to select integers from m and n depending on the target anti-reflectivity, and compatibility with other components used in the composition of the present invention. When balance between water solubility, stability over time of a resulting film, and refractive index are concerned, n is an integer from 1 to 20, preferably an integer from 4 to 12, and more preferably 8. The optimum integer depends on other components. However, if n is less than 4, objective anti-reflective effects are sometimes not obtained because a low refractive index cannot be maintained. In contrast, if it exceeds 12, water solubility and stability over time of the resulting film are sometimes not developed to a practical level.

In addition, from the viewpoint of a low refractive index, m is an integer from 0 to 20, and when n is smaller, it is more preferable. From the viewpoints of ease of synthesis, water solubility, and stability over time of a resulting film, m is preferably 0 or 1. Furthermore, the component (A) may be a simple compound or a mixture of several compounds.

There is no limitation on production methods for the component (A). For example, the production method disclosed in U.S. Pat. No. 3,825,577, that is, the production method in which fluorinated alkyl group containing sulfonyl halide is heated at 100° C. for eight hours in the presence of 100 times equivalent weight of water and about 5 times equivalent weight of concentrated sulfonic acid to hydrolyze as much of the fluorinated alkyl group containing sulfonyl halide, after completion of the hydrolysis reaction, the obtained reaction liquid is extracted using diethyl ether to dissolve fluorinated alkyl group containing sulfonic acid in ether, then the ether is removed by distillation.

The main functions of the organic amine, the component (B) is mainly adjusting the pH of the composition according to the present invention. Matching to resist which will become a substrate, and consequently lithography properties are improved by using the component (B).

The organic amine which is the component (B) is not particularly limited. Examples of the organic amine include hydrated tetraalkyl ammoniums such as hydrated tetramethyl ammonium, and hydrated tetraethyl ammonium; alkanol amines such as monometanol amine, dimethanol amine, trimethanol amine, dimethylmethanol amine, diethylmethanol amine, methyldimethanol amine, ethyldimethanol amine, monoethanol amine, diethanol amine, triethanol amine, dimethylethanol amine, diethylethanol amine, methyldiethanol amine, and ethyldiethanol amine; alkyl amines such as methylamine, dimethylamine, trimethylamine, ethylamine, diethylamine, triethylamine, propylamine, butylamine, cyclohexylamine, ethylenediamine, dimethylethylenediamine, diethylethylene diamine, diethylenetriamine, triethylenetetramine, tetramethyl-1,3-propanediamine, tetramethyl-1,6-hexanediamine, etc. These organic amines may be used alone or in combination.

According to the knowledge of the present inventors, alkanol amine is preferable among these organic amines because compatibility with the component (A) is excellent. Moreover, from the viewpoint of compatibility in the composition of the present invention, matching to the photoresist which will become a substrate, and improvement of lithography properties, triethanol amine is the most preferable.

The water-soluble polymer, the component (C) used in the anti-reflective coating composition of the present invention is a component which forms a stable film for a long time on the resist film after the composition of the present invention is coated uniformly on the resist film. Any polymer can be used as long as the solubility to water is 0.1% by mass or more.

Examples of the component (C) include poly(vinyl alcohol), poly(acrylic acid), poly(vinyl pyrrolidone), poly(α-trifluoromethylacrylic acid), vinylmethyl ether-maleic anhydride copolymer, ethylene glycol-propylene glycol copolymer, N-vinyl pyrrolidone-vinyl acetate copolymer, N-vinyl pyrrolidone-vinyl alcohol copolymer, N-vinyl pyrrolidone-acrylic acid copolymer, N-vinyl pyrrolidone-methyl acrylate copolymer, N-vinyl pyrrolidone-maleic acid copolymer, N-vinyl pyrrolidone-methyl maleate copolymer, N-vinyl pyrrolidone-maleic acid copolymer, N-vinyl pyrrolidone-dimethyl malate copolymer, N-vinyl pyrrolidone-maleic anhydride copolymer, N-vinyl pyrrolidone-itaconic acid copolymer, N-vinyl pyrrolidone-methyl itaconate copolymer, N-vinyl pyrrolidone-itaconic anhydride copolymer, and fluorinated polyether etc. Among these, from the viewpoint of coating suitability onto resist surfaces of various shapes or kinds, stability over time of a resulting film, resist dimensional stability, low refractive index, and solubility in water, poly(acrylic acid), poly(vinylpyrrolidone), fluorinated polyether, etc. are preferable. These components can be used alone or in combination as the component (C).

The production method for the component (C) is not limited, and the process for producing the polymer is also not particularly limited. A hydrophilic unit may be introduced into a water-soluble polymer by any polymerization method such as bulk polymerization, emulsion polymerization, suspension polymerization, or solution polymerization of the hydrophilic unit itself according to polymerization mechanism such as radical polymerization, anionic polymerization, and cationic polymerization, or alternatively by a method of producing a hydrophilic unit-free polymer and then substituting it with the hydrophilic unit, or these method may be combined.

The weight average molecular weight of the water-soluble polymer, which is the component (C), is preferably 1,000 to 1,000,000, and more preferably 2,000 to 100,000. If it is less than 1,000, it becomes difficult to obtain a uniform coating and simultaneously the stability over time of a resulting film is degraded. In contrast, it exceeds 1,000,000, threading occurs at the time of coating, and the spreading of the coating on the resist surface is poor, so a uniform coating cannot be formed by using a small drop amount of the coating composition.

The component (D) is a perfluoroalkylethyl group containing compound represented by the following formula (2):

$$C_kF_{2k+1}CH_2CH_2-X-Y \qquad (2)$$

The component (D) is mainly used to improve coating properties and adjust the pH of the anti-reflective coating composition, and to optimize the refractive index of the resulting anti-reflective film. In the formula (2), k represents an integer from 1 to 20, x represents a single bond or a divalent linking group, y represents an anionic group or a nonionic group, and this compound has a structure different from that of the component (A).

In the formula (2), X is selected depending on coating properties and the refractive index of the target anti-reflective coating composition, and water solubility of the compound represented by the formula (2). Specifically, examples of X include a single bond, alkylene group, substituted alkylene group, ether group, thioether group, amide group, sulfone amide group, urethane group, urea group, $-SO_2-$, $-N(R_1)-$ (wherein, $R_1$ represents a hydrogen or an alkyl group having 1 to 8 carbons), etc. These may be used alone or in combination.

Among these, from the viewpoint of water solubility and compatibility to the other components, $-O-$, $-S-$, $-O-CH_2CH_2-$, $-S-CH_2CH_2-$, $-O-CH_2CH(CH_3)-$, and $-S-CH_2CH(CH_3)-$ are preferable. In addition, from the viewpoint of water solubility and compatibility to the component (C), groups having $-O-$ or $-S-$ are more preferable, and $-S-CH_2CH_2-$ is the most preferable.

Y is a terminal structure which decides ionic properties. Examples of Y include anionic groups such as a carboxyl group, sulfonic acid group, and phosphoric acid group. Among these, a carboxylic group is preferable. Examples of nonionic groups include a hydroxyl group, alkyl group, alkoxy group, and halogen group. From the viewpoint of compatibility to the component (A), anionic groups are preferable, and a carboxyl group (COOH) is more preferable.

Examples of the component (D) include, but are not limited to:
$C_6F_{13}CH_2CH_2—O—CH_2CH_2OH$, $C_6F_{13}CH_2CH_2—O—CH_2CH_2O—CH_2CH_2OH$, $C_6F_{13}CH_2CH_2—O—CH_2CH_2O—CH_3$, $C_8F_{17}CH_2CH_2—O—CH_2CH_2OH$, $C_6F_{13}CH_2CH_2—O—C_3H_6OH$, $C_6F_{13}CH_2CH_2—S—CH_2CH_2OH$, $C_6F_{13}CH_2CH_2—S—CH_2CH_2—COOH$, $C_6F_{13}CH_2CH_2—S—CH_2CH_2—COOCH_3$, $C_8F_{17}CH_2CH_2—S—CH_2CH_2—COOH$, $C_6F_{13}CH_2CH_2—S—CH_2CH(CH_3)—COOH$, $C_6F_{13}CH_2CH_2—O—CH_2CH_2—SO_3H$, and $C_6F_{13}CH_2CH_2—O—CH_2CH_2—O—PO(OH)_2$.

In the formula (2), k represents an integer from 1 to 20. From the viewpoint of water solubility, k is preferably an integer from 4 to 12, and more preferably 6.

According to the knowledge of the present inventors, it is preferable that k be an integer from 4 to 12, Y be a carboxyl group, and it is more preferable that k be 6, X be —S—$CH_2CH_2$—, and Y be a carboxyl group in the formula (2) denoting the component (D).

The production method for the component (D) is not particularly limited, however, the component (D) is easily synthesized by a reaction between perfluoroalkylethyl iodide and 3-mercaptopropionic acid to remove hydrogen iodide.

Water of the component (E) in the anti-reflective coating composition of the present invention is not particularly limited as long as it is water, but it is preferable to use water from which organic impurities, metal ions etc. were removed by distillation, ion-exchange treatment, filtration, and various adsorption treatments.

For the purpose of improving coating properties, a water soluble organic solvent can also be used with water in the component (E). The water-soluble organic solvent is not particularly limited as long as it is dissolved in an amount of 0.1% by mass or more. Examples of the organic solvents include alcohols such as methyl alcohol, ethyl alcohol, and isopropyl alcohol; ketones such as acetone and methyl ethyl ketone; esters such as methyl acetate, ethyl acetate, and ethyl lactate; and polar solvents such as dimethyl formamide, diethyl sulfoxide, methyl cellosolve, cellosolve, butyl cellosolve, cellosolve acetate, alkyl cellosolve acetate, butyl carbitol, and carbitol acetate; etc. These organic solvents are described as mere examples, and the organic solvent used in the present invention is not limited to these solvents.

The component (A) is a main solid component in the anti-reflective coating composition of the present invention, and used as an aqueous solution of 0.1 to 25% by mass, preferably 1 to 10% by mass, and more preferably 2 to 4% by mass. There is no limitation on mass ratio between the components (A), (B), (C), and (D) in the anti-reflective coating composition. The suitable mass ratio varies depending on the objective resist material, exposure apparatus, anti-reflective performance, shape of the substrate, etc. The main component of the anti-reflective film is the component (A). The component (B) acts as a pH adjuster, and it is not necessary to add an excess amount of the component (B) to the component (A). The component (C) is essential for forming the anti-reflective film, but it is preferable to contain a small amount from the viewpoint of the refractive index. The content of the component (D) is decided to adjust the pH of the coating composition, improve coating properties, and optimize the refractive index of the anti-reflective film. When these factors are concerned, and the content of the component (C) is assumed to be 1 in a mass ratio, the combination ratio between the components (A), (B), and (D) ((A)/(B)/(D)) is preferably 2.0 to 7.0/0.1 to 1.0/0.01 to 1.5, and more preferably 3.0 to 5.0/0.1 to 1.0/0.05 to 1.2.

When the chemical amplification resist is a positive type, the anti-reflective coating composition in neutral to acidic conditions is preferably used. The pH of the anti-reflective coating composition of the present invention is generally 7 or less, preferably 1.0 to 4.0, and more preferably 1.6 to 2.6.

In addition, the anti-reflective coating composition of the present invention may contain additives as long as the properties are not damaged. Examples of the additives include anionic surfactants such as fluorine based surfactants other than the components (A) and (D), and silicon based surfactants, carbon hydride based surfactants, cationic surfactants, nonionic surfactants, and ampholytic surfactants.

Examples of the nonionic surfactant include polyoxyethylene alkyl ethers such as polyoxyethylene lauryl ether, polyoxyethylene oleyl ether, and polyoxyethyelen cetyl ether, polyoxyethylene aliphatic diester, polyoxyethylene aliphatic monoester, polyoxyethylene polyoxypropylene block copolymer, and acetylene glycol derivatives.

Examples of the anionic surfactant include alkyldiphenyl ether disulfonic acid, and ammonium salt and organic amine salt thereof; alkyldiphenyl ether sulfonic acid, and ammonium salt and organic amine salt thereof; alkylbenzene sulfonic acid, and ammonium salt and organic amine salt thereof; polyoxyethylene alkyl ether sulfuric acid, and ammonium salt and organic amine salt thereof; and alkyl sulfuric acid, and ammonium salt and organic amine salt thereof.

Examples of the ampholytic surfactant include 2-alkyl-N-carboxymethyl-N-hydroxyethyl imidazolinium Betaine, and lauric acid amide propyl hydroxysulfone Betaine.

In addition, the reduced thickness of the anti-reflective film may be optimized by adjusting a baking temperature and a baking time of a resist and an anti-reflective coating composition, besides optimizing the composition of the anti-reflective coating composition. A pre-baking temperature of a resist is classified into two systems depending on the composition of the resist. That is, one system requires high energy, and it is necessary to bake a resist generally in a range from about 100 to 150° C. in the one system. In contrast, the other system requires less energy than that in the one system, that is, a resist is baked at less than 100° C. in the other system. Moreover, a pre-baking temperature for the anti-reflective coating composition is in a range from 60 to 100° C. which is sufficient temperature to dry an ordinal solvent. In addition, baking the resist after exposure is generally carried out in a range from about 100 to 150° C. For example, when a pattern shape after developing is a T-top, a T-top can be sometimes be shaped by adjusting the pre-baking temperature of the resist to a lower temperature and adjusting the pre-baking temperature of the anti-reflective coating composition to a high temperature such as 100° C. or more. In addition, it is possible to prevent the occurrence of a reduced thickness which exerts adverse effects on etching by peeling or removing by dissolution the anti-reflective coating composition, after exposure, if possible.

The thickness of the anti-reflective film prepared by using the anti-reflective coating composition of the present invention is a thickness which has sufficient chemical functions such that the thickness of the resist film is more reduced in the developing process than the reduced thickness in the case of not using the anti-reflective coating composition, preferably 80 to 10,000 Å, and more preferably 330 to 990 Å. Moreover, it is possible to coat the anti-reflective coating composition by any conventional method such as spin coating.

Any positive type chemical amplification resist can be used as a resist in the present invention. Examples of the positive type chemical amplification resist include a resist comprising a combination between triphenyl sulfonium•hexafluoroacenate and poly(p-tert-butoxycarbonyloxy-α-methylstyrene) starting with a resist having a combination between polymer, in which polyhydroxystyrene is protected with a t-butoxycarbonyl group, and a photoacid generating agent. In addition, the thickness of the resist may be a thickness such that the obtained resist pattern is etched without problems in an etching process, and is generally about 0.3 to 1.0 μm.

The production method for a pattern of the present invention is preferably used not only for a substrate having a size of about six inches which is usually used but also a substrate having a large diameter such as a size of 8 inches or more. As a substrate, a silicon substrate is generally used. Of course, silicon substrates, on which a metal film, an oxide film such as silicon oxide, silicon nitride, and silicon oxynitride, or a nitride film is formed, are also used. In addition, substrate material is not limited to silicon, and any material, which is used in a conventional LSI and IC production methods, can also be used. Any coating method of the positive type chemical amplification photoresist, baking method of the positive type chemical amplification photoresist film or a film made of the anti-reflective coating composition, exposing method, developer, or developing method and any conditions in these methods can be used as long as the methods and the conditions have been used to produce a pattern using a conventional positive type chemical amplification photoresist. In addition, any ultraviolet ray, extravital ultraviolet ray, X-ray, or electron ray can be used as an exposing ray source in the exposing process.

EXAMPLES

Hereinafter, the present invention is described in detail with reference to Examples and Comparative Examples. Of course, the present invention is not limited to Examples and Comparative Examples.

Example 1

In Example 1, 0.4 parts by mass of $C_6F_{13}CH_2CH_2$—$SCH_2CH_2$—COOH (in the formula (2), k is 6, X is —$SCH_2CH_2$—, and Y is COOH) as the compound having a perfluoroalkylethyl group which is the component (D), 0.28 parts by mass of triethanol amine as the component (B), and 40 parts by mass of purified water as the component (E) were mixed at room temperature (23° C.) until they dissolved uniformly.

Then, 2.58 parts by mass of $C_8F_{17}(CH_2CH_2)SO_3H$ (in the formula (1), n is 8, and m is 1) which is the component (A), 0.74 parts by mass of poly(vinyl pyrrolidone) having a mass average molecular weight of 45,000 which is the component (C), and 65 parts by mass of purified water which is the component (E) were added to the obtained aqueous solution, and they were dissolved uniformly at room temperature (23° C.). After that, the solution was filtrated through a filter of 0.1 μm to produce an anti-reflective coating composition.

The pH of the obtained anti-reflective coating composition was about 2.15. A positive type photoresist (AZ® DX3301P, marketed by Clariant International Ltd.) which is an acetal based polymer was coated on an 8-inch silicon wafer using a spin-coater (Mark 8, marketed by Tokyo Electron Ltd.), then it was pre-baked at 90° C. for 90 seconds to form a resist film having a thickness of 510 nm on the silicon wafer. The thickness was measured by using a film thickness measuring device (SM300, marketed by Prometric).

After that, the obtained anti-reflective coating composition was coated on the photoresist using the same spin-coater as was used previously, and this was pre-baked at 90° C. for 60 seconds to form an anti-reflective film having a thickness of 450 Å on the photoresist.

Then, the photoresist film was exposed using a KrF stepper (FPA 3000-EX5, marketed by Canon Inc.), and was subjected to post-exposure baking (PEB) on a hot plate at 110° C. for 60 seconds. After that, the photoresist was paddle-developed in an alkali developer (AZ® 300MIF developer, marketed by Clariant International Ltd.; 2.38% by mass-tetramethyl ammonium hydroxide aqueous solution) at 23° C. for 1 minute to obtain a resist pattern.

Then, the thickness of the resist after developing was also measured using the same film thickness measuring device as was previously used. The reduced thickness was denoted by the difference between the thickness of the resist before and after developing.

Furthermore, a substrate for evaluation was prepared by coating using a spin-coater (Mark 8, marketed by Tokyo Electron Ltd.) with a chemical amplification positive type photoresist (AZ® DX3310P, marketed by Clariant International Ltd.) which was an acetal based polymer on an 8-inch silicon wafer which had been subjected to a HMDS (1,1,1,3,3,3,-hexamethyl disilazane) treatment, then this was pre-baked at 90° C. for 90 seconds to form a resist film having a thickness of 510 nm on the silicon wafer. Next, a sample of the anti-reflective coating composition was dropped on the obtained substrate using the spin-coater, and a minimum drop amount which is necessary to form a uniform film on the entire 8-inch wafer was examined. The less the minimum drop amount is, the better the coating properties are. When the minimum drop amount is less than 2.5 ml, the coating properties are excellent.

The added amount (parts by mass) of the components, the cross-sectional pattern shape of the resist, reduced thickness, pH of the anti-reflective coating composition, refractive index of the anti-reflective film at 248 nm, and minimum drop amount are shown in Table 1.

Examples 2 to 4

The anti-reflective coating composition was prepared and evaluated in a manner identical to that of Example 1, except that the amount of added $C_6F_{13}CH_2CH_2$—$SCH_2CH_2$—COOH which is the component (D) and purified water which is the component (E) was changed. The added amount (parts by mass), the pattern shape, reduced thickness, pH, refractive index, and minimum drop amount are shown in Table 1.

TABLE 1

Blending ratio and Evaluation results

|  | Example 1 | Example 2 | Example 3 | Example 4 |
|---|---|---|---|---|
| $C_8F_{17}CH_2CH_2SO_3H$ (parts by mass) | 2.58 | 2.58 | 2.58 | 2.58 |
| Triethanol amine (parts by mass) | 0.28 | 0.28 | 0.28 | 0.28 |
| Poly(vinyl pyrrolidone) (parts by mass) | 0.74 | 0.74 | 0.74 | 0.74 |
| $C_6F_{13}CH_2CH_2SCH_2CH_2COOH$ (parts by mass) | 0.40 | 0.30 | 0.20 | 0.10 |
| Purified water (parts by mass) | 96.00 | 96.10 | 96.20 | 96.30 |
| Pattern shape | rectangle | rectangle | rectangle | rectangle |
| Reduced thickness (Å) | 150.0 | 150.1 | 150.7 | 151.8 |
| pH | 2.15 | 2.15 | 2.16 | 2.17 |
| Refractive Index | 1.44 | 1.44 | 1.45 | 1.45 |
| Minimum drop amount (ml) | 2.0 | 2.0 | 2.0 | 2.5 |

Example 5

The anti-reflective coating composition was prepared and evaluated in a manner identical to that of Example 1, except that triethanol amine which is the component (B) was changed to dimethyl amino ethanol, and the added amount thereof was changed. The added amount (parts by mass), the pattern shape, reduced thickness, pH, refractive index, and minimum drop amount are shown in Table 2.

Example 6

The anti-reflective coating composition was prepared and evaluated in a manner identical to that of Example 1, except that triethanol amine which is the component (B) was changed to monoethanol amine, and the added amount thereof was changed. The added amounts (parts by mass), the pattern shape, reduced thickness, pH, refractive index, and minimum drop amount are shown in Table 2.

TABLE 2

Blending ratio and Evaluation results

|  | Example 5 | Example 6 |
|---|---|---|
| $C_8F_{17}CH_2CH_2SO_3H$ (parts by mass) | 2.58 | 2.58 |
| Diethylamino ethanol (parts by mass) | 0.17 |  |
| Monoethanol amine (parts by mass) |  | 0.12 |
| Poly(vinylpyrrolidone) (parts by mass) | 0.74 | 0.74 |
| $C_6F_{13}CH_2CH_2SCH_2CH_2COOH$ (parts by mass) | 0.40 | 0.40 |
| Purified water (parts by mass) | 96.11 | 96.16 |
| Pattern shape | rectangle | rectangle |
| Reduced thickness (Å) | 148.6 | 147.7 |
| pH | 2.11 | 2.13 |
| Refractive index | 1.44 | 1.44 |
| Minimum drop amount (ml) | 2.0 | 2.0 |

Example 7

The anti-reflective coating composition was prepared and evaluated in a manner identical to that of Example 1, except that the perfluoroalkyl alkylenesulfonic acid was changed to $C_8F_{17}SO_3H$ (in the formula (1), n is 8, and m is 0). The added amount (parts by mass), the pattern shape, reduced thickness, pH, refractive index, and minimum drop amount are shown in Table 3.

TABLE 3

Blending ratio and Evaluation results

|  | Example 7 |
|---|---|
| $C_8F_{17}SO_3H$ (parts by mass) | 2.58 |
| Triethanol amine (parts by mass) | 0.28 |
| Poly(vinyl pyrrolidone) (parts by mass) | 0.74 |
| $C_6F_{13}CH_2CH_2SCH_2CH_2COOH$ (parts by mass) | 0.40 |
| Purified water (parts by mass) | 96.00 |
| Pattern shape | rectangle |
| Reduced thickness (Å) | 200 |
| pH | 2.15 |
| Refractive index | 1.44 |
| Minimum drop amount (ml) | 2.0 |

Comparative Example 1

The anti-reflective coating composition was prepared by blending the components (A), (C), and (E) which were used in Example 1 so as to have the composition shown in Table 4, without the components (B) and (D), dissolving them uniformly at room temperature, and filtrating it with a filter of 0.1 µm. The obtained anti-reflective coating composition was evaluated in a manner identical to that of Example 1. The added amount (parts by mass), the pattern shape, reduced thickness, pH, refractive index, and minimum drop amount are shown in Table 4.

Comparative Examples 2 to 4

Anti-Reflective Coating Composition not Coating the Component (D)

The anti-reflective coating composition was prepared by adding, as the component (B), triethanol amine (Comparative Example 2), dimethylamino ethanol (Comparative Example 3), or monoethanol amine (Comparative Example 4) to the components used in Comparative Example 1 so as to have the composition shown in Table 4, dissolving them uniformly at room temperature, and filtrating it with a filter of 0.1 µm. The obtained anti-reflective coating composition was evaluated in a manner identical to that of Example 1. The added amount (parts by mass), the pattern shape, reduced thickness, pH, refractive index, and minimum drop amount are shown in Table 4.

TABLE 4

Blending ratio and Evaluation results

| | Comparative Example 1 | Comparative Example 2 | Comparative Example 3 | Comparative Example 4 |
|---|---|---|---|---|
| $C_8F_{17}CH_2CH_2SO_3H$ (parts by mass) | 2.58 | 2.58 | 2.58 | 2.58 |
| Triethanol amine (parts by mass) | | 0.28 | | |
| Diethylamino ethanol (parts by mass) | | | 0.17 | |
| Monoethanol amine (parts by mass) | | | | 0.12 |
| Poly(vinyl pyrrolidone) (parts by mass) | 0.74 | 0.74 | 0.74 | 0.74 |
| Purified water (parts by mass) | 96.68 | 96.40 | 96.51 | 96.56 |
| Pattern shape | slightly rounded top | rectangle | rectangle | rectangle |
| Reduced thickness (Å) | 190.0 | 145.9 | 153.6 | 146.4 |
| pH | 1.88 | 2.19 | 2.11 | 2.15 |
| Refractive index | 1.44 | 1.45 | 1.45 | 1.45 |
| Minimum drop amount (ml) | 5.0 | 3.0 | 3.0 | 3.0 |

Comparative Example 5

The anti-reflective coating composition was prepared by using the same components as that of Example 7 except that the component (D) was not blended and the blending amount of the component (E) was changed, dissolving them uniformly at room temperature, and filtrating it with a filter of 0.1 μm. The obtained anti-reflective coating composition was evaluated in a manner identical to that of Example 1. The added amount (parts by mass), the pattern shape, reduced thickness, pH, refractive index, and minimum drop amount are shown in Table 5.

Comparative Example 6

The anti-reflective coating composition was prepared by changing the compound and the added amount of the components (A) and (B) used in Comparative Example 5 to those shown in Table 5, using perfluorohexylsulfone amide, and adjusting the added amount of the components (C) and (E) to those shown in Table 5. The obtained anti-reflective coating composition was evaluated in a manner identical to that of Example 1. The added amount (parts by mass), the pattern shape, reduced thickness, pH, refractive index, and minimum drop amount are shown in Table 5.

TABLE 5

Blending ratio and Evaluation results

| | Comparative Example 5 | Comparative Example 6 |
|---|---|---|
| $C_8F_{17}SO_3H$ (parts by mass) | 2.58 | 1.60 |
| $C_7F_{15}SO_3H$ (parts by mass) | | 0.10 |
| $C_6F_{13}SO_3H$ (parts by mass) | | 1.20 |
| $C_5F_{11}SO_3H$ (parts by mass) | | 0.50 |
| $C_4F_9SO_3H$ (parts by mass) | | 0.20 |
| Triethanol amine (parts by mass) | 0.28 | |
| Monoethanol amine (parts by mass) | | 0.38 |
| Poly(vinyl pyrrolidone) (parts by mass) | 0.74 | 1.0 |
| $C_6F_{13}SO_2NH_2$ (parts by mass) | | 0.7 |
| Purified water (parts by mass) | 96.40 | 94.32 |
| Pattern shape | rectangle | rectangle |
| Reduced thickness (Å) | 190 | 219 |
| pH | 2.2 | 2.2 |
| Refractive index | 1.44 | 1.42 |
| Minimum drop amount (ml) | 3.5 | 3.5 |

It is clear from the results of Tables 1 to 5 that the minimum drop amount in Examples 1 to 7 was 2.5 ml or less, and this was less than that in Comparative Examples 1 to 6.

From these results, it is confirmed that it is possible to produce an anti-interferential film which has high coating properties by using the anti-reflective coating composition of the present invention, that is, an anti-interferential film having a small minimum drop amount which is sufficient to prevent the decrease of the pattern size accuracy (variation of pattern width) generated by interference with reflective light from a substrate in a photoresist film, and a resist pattern which does not cause a degradation of the pattern shape such as a T-top and a rounded top which is caused by an intermix of chemical amplification resist and the anti-reflective film.

INDUSTRIAL APPLICABILITY

According to the present invention, it is possible to provide an anti-interferential film which has high coating properties, that is, an anti-interferential film having a small minimum drop amount which is sufficient to prevent the decrease of the pattern size accuracy (variation of pattern width) generated by interference with reflective light from a substrate in a photoresist film; a production method for a resist pattern which does not cause a degradation of a pattern shape such as a T-top and a rounded top which is caused by an intermix of the chemical amplification resist and the anti-reflective film; and an anti-reflective coating composition used in the production method for a resist pattern.

The invention claimed is:

1. An anti-reflective coating composition comprising at least the following components (A), (B), (C), (D), and (E):

(A) perfluoroalkyl·alkylenesulfonic acid represented by the following formula (1):

$$C_nF_{2n+1}(CH_2CH_2)_mSO_3H \quad (1)$$

(wherein, n represents an integer from 1 to 20, and m represents an integer from 0 to 20);

(B) organic amine;
(C) water-soluble polymer;
(D) perfluoroalkylethyl group containing compound represented by the following formula (2):

$$C_kF_{2k+1}CH_2CH_2-X-Y \quad (2)$$

(wherein, k represents an integer from 1 to 20, x represents —O—CH$_2$CH$_2$—, —S—CH$_2$CH$_2$—, —O—CH$_2$CH(CH$_3$)—, or —S—CH$_2$CH(CH$_3$)—, y represents a carboxyl group, sulfonic acid group, or phosphoric acid group); and
(E) water.

2. The anti-reflective coating composition according to claim 1, wherein the component (B) is alkanol amine.

3. The anti-reflective coating composition according to claim 1, wherein in the formula (1), n is 8, and m is 0 or 1.

4. The anti-reflective coating composition according to claim 1, wherein in the formula (2), k is an integer from 4 to 12, and Y is a carboxyl group.

5. The anti-reflective coating composition according to claim 1, wherein k is 6, X is —S—CH$_2$CH$_2$—, and Y is a carboxyl group in the formula (2).

6. The anti-reflective coating composition according to claim 1, wherein when a content of the component (C) is assumed to be 1 in a mass ratio, a mass ratio between the components (A), (B), and (D) ((A)/(B)/(D)) is 2.0 to 7.0/ 0.1 to 1.0/ 0.01 to 1.5.

7. A production method for a pattern comprising a process in which the anti-reflective coating composition according to claim 1 is coated on a photoresist and heated.

\* \* \* \* \*